(12) United States Patent
Otsuka

(10) Patent No.: US 8,247,164 B2
(45) Date of Patent: Aug. 21, 2012

(54) RESIST FILM FORMING METHOD

(75) Inventor: Takahisa Otsuka, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 281 days.

(21) Appl. No.: 12/782,930

(22) Filed: May 19, 2010

(65) Prior Publication Data

US 2010/0297552 A1 Nov. 25, 2010

(30) Foreign Application Priority Data

May 25, 2009 (JP) .................................. 2009-125421

(51) Int. Cl.
 G03F 7/00 (2006.01)
 G03F 7/004 (2006.01)
 G03F 7/095 (2006.01)
 G03F 7/40 (2006.01)
(52) U.S. Cl. .................. 430/312; 430/270.1; 430/271.1; 430/273.1; 430/322; 430/330; 430/331; 430/394
(58) Field of Classification Search ............... 430/270.1, 430/271.1, 312, 330, 331, 273.1, 394, 322
See application file for complete search history.

(56) References Cited

U.S. PATENT DOCUMENTS

| 6,509,137 | B1 * | 1/2003 | Wang et al. .................... 430/312 |
| 6,653,244 | B2 * | 11/2003 | Behfar et al. .................. 438/780 |
| 8,026,044 | B2 * | 9/2011 | Lee et al. ....................... 430/312 |
| 8,097,398 | B2 * | 1/2012 | Kondoh et al. ............. 430/273.1 |
| 8,105,760 | B2 * | 1/2012 | Hatakeyama et al. ........ 430/315 |
| 8,124,312 | B2 * | 2/2012 | Ishikawa et al. ........... 430/270.1 |
| 8,129,100 | B2 * | 3/2012 | Takemura et al. ............ 430/326 |
| 2009/0280440 | A1 * | 11/2009 | Tarutani et al. ............... 430/325 |
| 2010/0310988 | A1 * | 12/2010 | Abe et al. .................. 430/270.1 |

FOREIGN PATENT DOCUMENTS

JP 2008-281825 A1 11/2008

* cited by examiner

Primary Examiner — Amanda C. Walke
(74) Attorney, Agent, or Firm — Burr & Brown

(57) ABSTRACT

The method prepares a substrate provided thereon with a first resist film having a first pattern of first pillars spaced at intervals, the pillars having a first height, and forms a second resist film on the substrate. The second resist film is formed by alternately performing, each at least twice, applying of a resist solution to the substrate such that at least the spaces between adjacent first pillars are filled with a resist solution having a thickness smaller than the first height, and by heat-treating of the substrate to solidify the resist solution thus applied, thereby forming a resist layer, whereby the spaces between the adjacent first pillars are filled with resist layers, as the second resist film, having a total thickness at least approximately equal to the first height.

14 Claims, 14 Drawing Sheets

RESIST FILM FORMING METHOD

TECHNICAL FIELD

The present invention generally relates to a technique for forming a resist film on a substrate such as a semiconductor wafer, and more particularly to a double-patterning technique.

BACKGROUND ART

In manufacturing of semiconductor devices, a photolithographic technique is used for forming a circuit pattern on a semiconductor wafer (hereinafter referred to simply as "wafer") as a substrate to be processed. In order to form a circuit pattern by using the photolithographic technique, there is performed a patterning process including, applying a resist onto a wafer to form thereon a resist film; irradiating light to the resist film such that the resist film is exposed correspondingly to the circuit pattern, and developing the resist film.

In terms of the recent trend of higher degree of integration of semiconductor devices with a view to improving the operation speed and the like, the photolithographic technique is required to further miniaturize a semiconductor circuit to be formed on a wafer. As the photolithographic technique capable of achieving a high resolution of 45 nm node, there has been proposed an immersion exposure that supplies an exposure liquid, such as deionized water, which has a refractive index higher than air, into a space between a wafer and a projection lens for exposure, thereby reducing a wavelength of light incident from the projection lens with the use of the high refractive index of the exposure liquid, so as to narrow the exposed line width. However, it is difficult to achieve the high resolution of 45 nm node only by the immersion exposure. Thus, with a view to achieving the high resolution of 45 nm node, it is under study that the immersion exposure technique is combined with a technique called double-patterning that forms a fine pattern by twice performing a pattering process including a resist application, an exposure, and a development.

The double-patterning is used for forming a fine resist pattern for etching a layer to be etched which is formed on a wafer. Namely, before the etching that etches the layer to be etched is performed, there is twice performed a patterning process employing the photolithographic technique and including a resist application, an exposure, and a development. A first patterning including a first resist application, an exposure, and a development is performed to form a first resist pattern of a first pitch. Then, a second patterning including a second resist application, an exposure, and a development is performed to add an additional resist pattern to spaces in the first resist pattern. Thus, a resist pattern of a pitch that is approximately a half of the first pitch can be formed as a whole. In order to perform the second patterning, it is necessary to perform a second resist application to the wafer, on which the first resist pattern is formed and which thus has a stepped surface (see, JP2008-281825A, for example).

When the second resist application is performed to the wafer that has been subjected to the first patterning, there arises the following problem.

When the second resist application is performed to the wafer that has been subjected to the first patterning, it is difficult to achieve a flat surface of the resist film due to the stepped surface of the first resist pattern formed by the first patterning.

Unless the resist film is flat, since optical path distances of the irradiated exposure light are different between the center portion of a space in the first resist pattern and the edge portion of the same, the line width of the pattern formed by the second patterning cannot have designed dimensions.

In addition, the fact that the resist film is not flat means that the resist film thickness formed by the second patterning is not uniform within the wafer plane. In-plane non-uniformity of the resist film thickness will result in in-plane non-uniformity of the line width of the pattern formed by the second patterning.

SUMMARY OF THE INVENTION

The present invention provides a technique that can improve flatness of and thickness uniformity of a resist film to be formed for the second patterning of the double-patterning process.

The present invention provides a resist film forming method including: preparing a substrate provided thereon with a first resist film having a first pattern of first pillars spaced at intervals, the pillars having a first height; and forming a second resist film on the substrate, including: applying a resist solution to the substrate such that at least the spaces between adjacent first pillars are filled with a resist solution having a thickness smaller than the first height; and heat-treating the substrate to solidify the resist solution thus applied, thereby forming a resist layer; wherein the applying of the resist solution and the heat-treating of the substrate are performed alternately each at least twice, whereby the spaces between the adjacent first pillars are filled with resist layers, as the second resist film, having a total thickness at least approximately equal to the first height.

In one preferred embodiment, due to second or more times applying of the resist solution, at least portions of the resist layer, which have been formed by preceding applying of the resist solution and preceding heat-treating of the substrate and which exist on a top of each of the first pillars of the first resist pattern, are dissolved to be removed.

In one preferred embodiment, the applying of the resist solution and the heat-treating of the substrate are performed alternately each exactly twice.

In one preferred embodiment, first applying of the resist solution applies the resist solution having a thickness less than a half of the first height.

In one preferred embodiment, a heat treatment temperature in first heat-treating of the substrate is lower than that in second or more times heat-treating of the substrate.

After the forming of the second resist film, exposure and development may be performed to the second resist film, thereby to provide the second resist film with a second pattern of second pillars such that each of the second pillars is located in a space defined between adjacent first pillars.

The preparing of the substrate may be performed by applying a resist solution onto the substrate and heat-treating the substrate, thereby forming the first resist film on the substrate, performing exposure and development to the first resist film, thereby providing the first resist film with the first pattern of first pillars, and forming a protective film on each of the first pillars of the first pattern.

DESCRIPTION OF PREFERRED EMBODIMENTS

With reference to FIGS. 1 to 12, a resist-pattern forming method in one embodiment is firstly described.

At first, a pattern forming system configured to perform the resist pattern forming method is described with reference to FIGS. 1 to 4.

Figure 1:
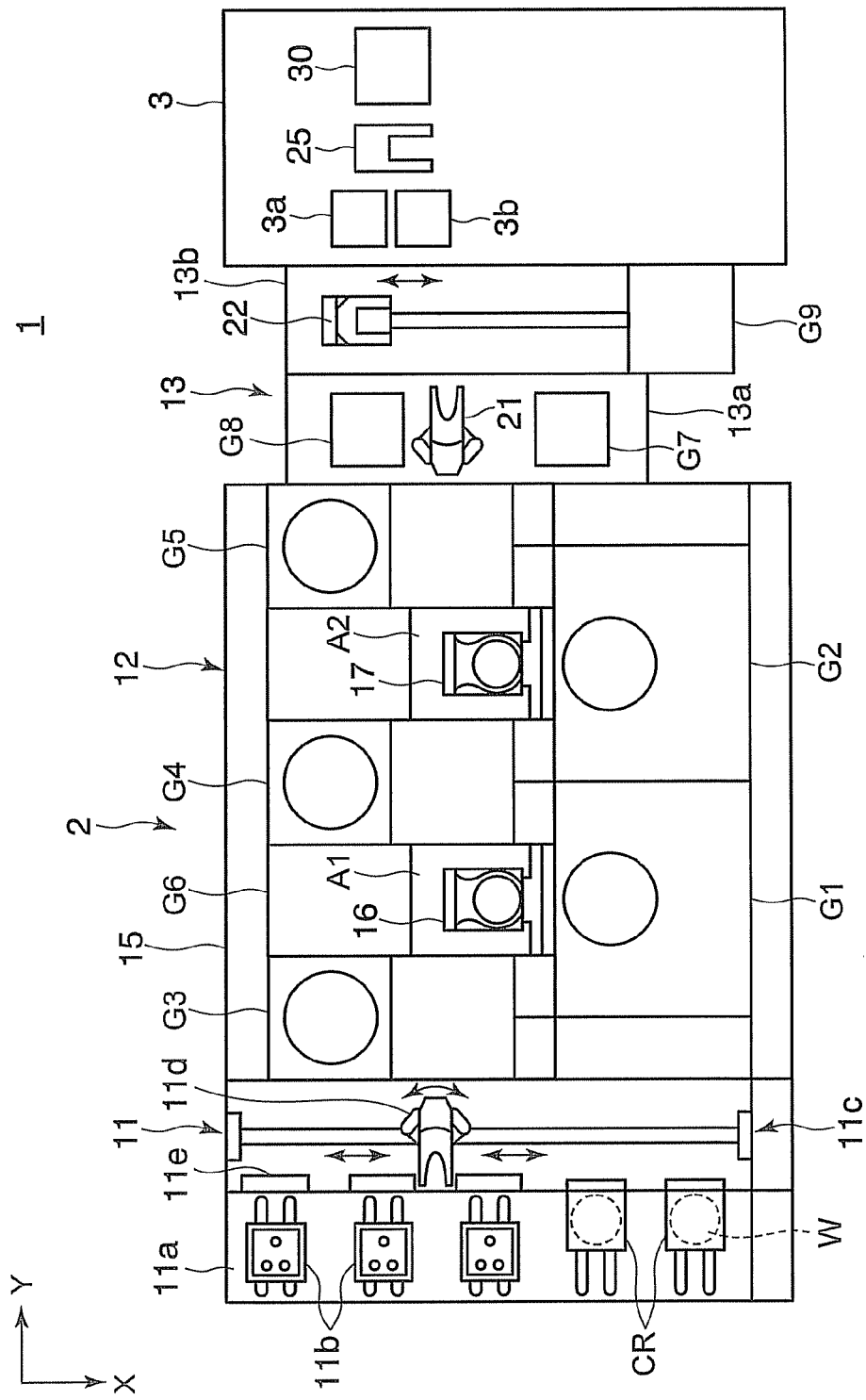
FIG. 1 is a schematic plan view of a pattern forming system.
Figure 2:
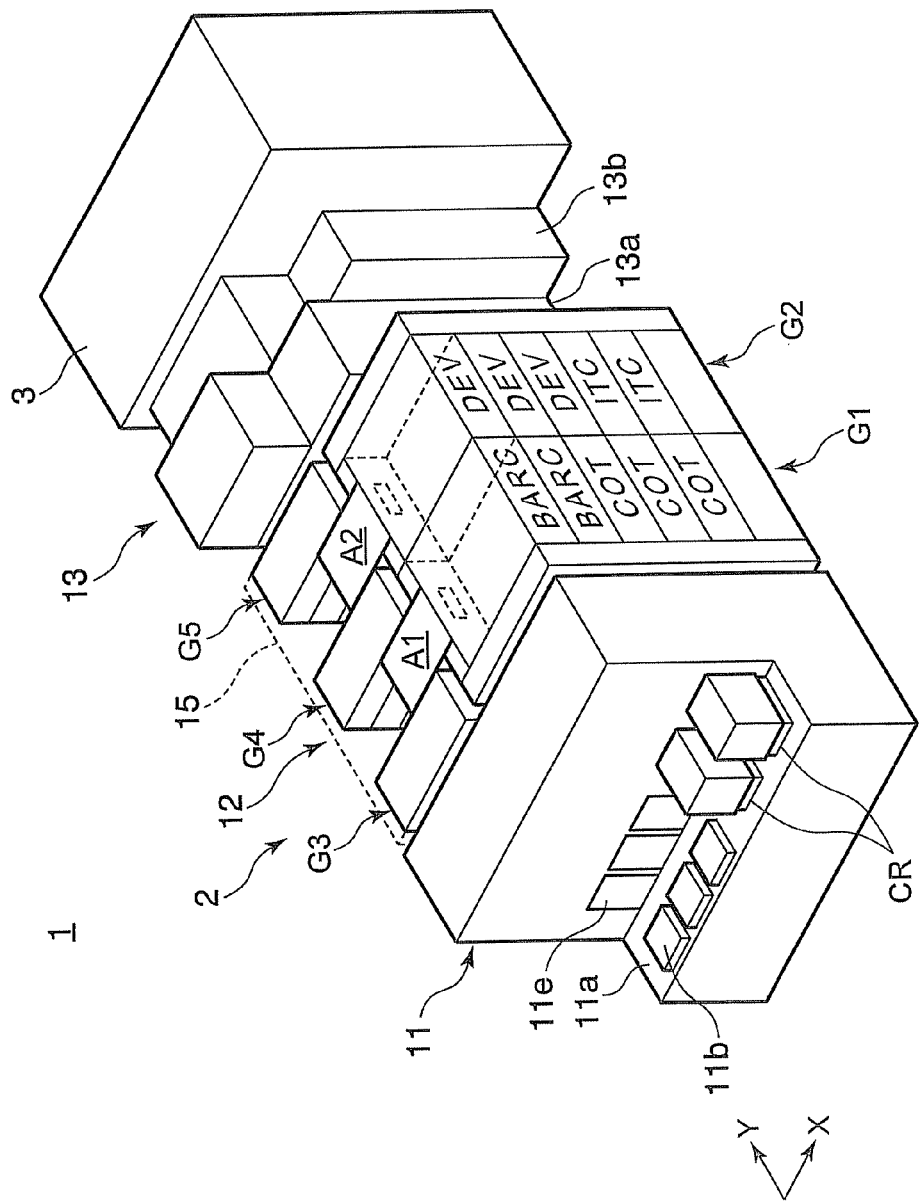
FIG. 2 is a schematic perspective view of the pattern forming system.
Figure 3:
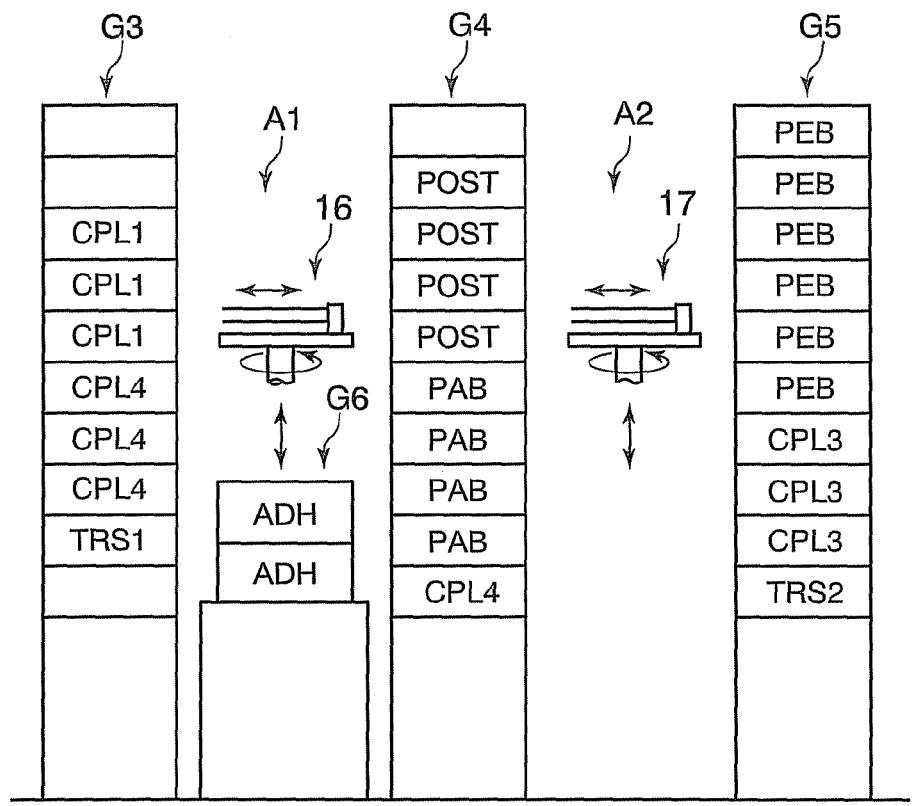
FIG. 3 is a diagram for explaining structures of a third processing unit group G3, a fourth processing unit group G4, and a fifth processing unit group G5, in an coating and developing apparatus of the pattern forming system.

FIG. 1 is a schematic plan view of the pattern forming system, and FIG. 2 is a schematic perspective view thereof. FIG. 3 is a diagram for explaining structures of a third processing unit group G3, a fourth processing unit group G4, and a fifth processing unit group G5, in a coating and developing apparatus of the pattern forming system.

As shown in FIGS. 1 and 2, the pattern forming system 1 is adapted to form a predetermined resist pattern on a wafer W which is a semiconductor substrate. The pattern forming system 1 includes a coating and developing apparatus 2 that applies a resist or the like onto the wafer W and develops the wafer W after exposure, and an exposure apparatus 3, constituted as an immersion exposure apparatus, that exposes the wafer W. The coating and developing apparatus 2 includes a cassette station 11 as a transfer station for the wafer W, a processing station 12 having a plurality of processing units for performing predetermined processes to the wafer W, and an interface station 13 via which the wafer W is conveyed between the processing station 12 and the exposure apparatus 3. The cassette station 11, the processing station 12, the interface station 13, and the exposure apparatus 3 are serially arranged in this order in a length direction (Y direction) of the pattern forming system 1.

The cassette station 11 includes a cassette table 11a on which a wafer cassette CR accommodating a plurality of, e.g., thirteen wafers W is placed, and a wafer transfer part 11c that transfers the wafer W between the wafer cassette CR placed on the cassette table 11a and a conveying unit TRS1, which is described below, disposed on the third processing unit group G3 of the processing station 12. A plurality of, e.g., five positioning units 11b for positioning the wafer cassette CR are disposed on the cassette table 11a in a width direction (X direction) of the pattern forming system 1. The wafer cassette CR is placed on the positioning unit 11b, such that an opened part of the wafer cassette CR is opposed to a shutter 11e provided on a wall surface of a housing of the wafer transfer part 11c. The wafer transfer part 11c includes a wafer pick 11d, which is capable of holding the wafer W and is arranged in the housing of the wafer transfer part 11c. The wafer W can be transferred by the transfer pick 11d between each wafer cassette CR on the cassette table 11a and the conveying unit TRS1.

The processing station 12 is disposed in a housing 15. On a front side (lower side in FIG. 1) of the processing station 12, the processing station 12 includes the first processing unit group G1 and the second processing unit G2 in this order from the side of the cassette station 11 to the side of the interface station 13. On a rear side (upper side in FIG. 1) of the processing station 12, the processing station 12 includes the third processing unit group G3, the fourth processing unit group G4, and the fifth processing unit group G5, in this order from the side of the cassette station 11 to the side of the interface station 13. In addition, the processing station 12 has a first main transfer unit A1 between the third processing unit group G3 and the fourth processing unit group G4, and a second main transfer unit A2 between the fourth processing unit group G4 and the fifth processing unit group G5. A sixth processing unit group G6 is arranged on a rear side of the first main transfer unit A1.

As shown in FIG. 2, the first processing unit group G1 is constituted by stacking two bottom coating units BARC for forming on the wafer W an anti-reflecting film for preventing reflection of light upon exposure, and three resist coating units COT for forming a resist film on the wafer W. The second processing unit group G2 is constituted, for example, by stacking three developing units DEV for developing the wafer W and two top coating units ITC each for forming a water-repellent protective film (topcoat film) on the surface of a resist film formed on the wafer W.

As shown in FIG. 3, the third processing unit group G3, the fourth processing unit group G4, and the fifth processing unit group G5 are constituted by stacking, e.g., at ten levels, processing units including: a pre-baking unit PAB that heat-treats the wafer W to which a resist has been applied; a post-baking unit POST that heats the developed wafer W; a post-exposure baking unit PEB that heats the wafer W before exposed, a cooling unit CPL1 as a temperature adjusting unit that adjusts the hydrophobized or pre-baked wafer W to a predetermined temperature; a cooling unit CPL3 as a temperature adjusting unit that adjusts the wafer W, which has been heated by the post-exposure baking unit PEB, to a predetermined temperature; and a cooling unit CPL4 that cools the wafer W which has been heated by the post-baking unit POST, for example. The sixth processing unit group G6 is constituted by stacking, e.g., at two levels, adhesion units ADH that hydrophobize the wafer W.

As shown in FIG. 3, the third processing unit group G3 includes the conveying unit TRS1 serving as a conveying part through which the wafer W is conveyed between the cassette station 11 and the first main transfer unit A1. On the other hand, the fifth processing unit group G5 includes a conveying unit TRS2 serving as a conveying part through which the wafer W is conveyed between the second main transfer unit A2 and the below-described first wafer transfer mechanism 21 of the interface station 13.

The pre-baking unit PAB and the post-baking unit POST respectively have heating plates, and are accessible from both the first main transfer unit A1 and the second main transfer unit A2. On the other hand, the post-exposure baking unit PEB has a heating plate for heating the wafer W and a cooling plate for cooling the heated wafer W, and is accessible by both the second main transfer unit A2 and the first wafer transfer mechanism 21.

The first main transfer unit A1 is provided with a first main wafer transfer arm 16 capable of holding the wafer W. The first main wafer transfer arm 16 can selectively access the respective units of the first processing unit group G1, the third processing unit group G3, the fourth processing unit group G4, and the sixth processing unit group G6. The second main transfer unit A2 is provided with a second main wafer transfer arm 17 capable of holding the wafer W. The second main wafer transfer arm 17 can selectively access the respective units of the second processing unit group G2, the fourth processing unit group G4, and the fifth processing unit group G5.

As shown in FIG. 1, the interface station 13 includes a first interface unit 13a arranged on the side of the processing station 12, and a second interface unit 13b arranged on the side of the exposure apparatus 3, which are accommodated in a housing. The first interface unit 13a has the first wafer transfer mechanism 21 for transferring the wafer W, such that the first wafer transfer mechanism 21 is opposed to openings of the fifth processing unit group G5. The second interface unit 13b has a second wafer transfer mechanism 22 for transferring the wafer W.

On the front side of the first interface unit 13a, there is disposed a seventh processing unit G7 constituted by stacking a periphery exposure apparatus, a buffer cassette for loading, a buffer cassette for unloading, a pre-cleaning unit, a post-cleaning unit, and so on. On the rear side of the first interface unit 13a, there is disposed an eighth processing unit group G8 constituted by stacking high-precision temperature adjusting units at two levels. On the front side of the second interface unit 13b, there is disposed a ninth processing unit G9 constituted by stacking an inspection units and a rejected wafer cassette at two levels.

As shown in FIG. 1, the exposure apparatus 3 includes: an in-stage 3a on which the wafer W, which has been transferred from the interface station 13, is placed; an out-stage 3b on which the wafer W to be transferred to the interface station 13 is placed; an immersion exposure part 30 that exposes a resist film formed on the wafer W while the wafer W is immersed in a predetermined liquid; and a wafer transfer mechanism 25 that transfers the wafer W among the in-stage 3a, the immersion exposure part 30, and the out-stage 3b.

Next, a processing operation of the pattern forming system 1 as structured above is described. At first, one wafer W is taken out from the wafer cassette CR by the transfer pick lid of the wafer transfer part 11c, and the wafer W is transferred to the conveying unit TRS1 disposed on the third processing unit group G3 in the processing station 12. Then, according to a predetermined sequence defined by a process recipe, the wafer W is sequentially transferred by the first and second main transfer units A1 and A2 to the predetermined units of the first to sixth processing unit groups G1 to G6, whereby the wafer W is subjected to a series of processes. For example, there are performed an adhesion process by the adhesion unit ADH, an anti-reflecting film forming process by the bottom coating unit BARC, a resist film forming process by the resist coating unit COT, a protective film forming process by the top coating unit ITC, and a pre-baking process by the pre-baking unit PAB. Thereafter, in the interface station 13, the wafer W is transferred by the first wafer transfer mechanism 21, so as to be subjected to a peripheral exposure process by the peripheral exposure apparatus, not shown, a pre-cleaning process by the pre-cleaning unit, not shown, a temperature adjusting process by which the temperature of the wafer W is adjusted to a predetermined temperature with high precision by means of the high-precision temperature adjusting unit, not shown. After that, the wafer W is transferred by the second wafer transfer mechanism 22 to the in-stage 3a of the exposure apparatus 3. Then, the wafer W is transferred to the immersion exposure part 30 by the wafer transfer mechanism 25 of the exposure apparatus 3, whereby the wafer W is subjected to an immersion exposure process.

Following thereto, the wafer W is transferred to the out-stage 3b by the wafer transfer mechanism 25, and then the wafer W is transferred by the second wafer transfer mechanism 22 of the interface station 13 so as to be subjected to a post-cleaning process by the post-cleaning unit, not shown. Thereafter, according to the predetermined sequence defined by the recipe, the wafer W is sequentially transferred by the first and second main transfer units A1 and A2 to the respective units of the first to fifth processing unit groups G1 to G5. For example, there are sequentially performed a post-exposure baking process by the post-exposure baking unit PEB, a developing process by the developing unit DEV, and a post-baking process by the post-baking unit POST. After that, the wafer W is transferred to the wafer cassette CR of the cassette station 11 via the conveying unit TRS1 disposed on the third processing unit group G3.

Figure 4:
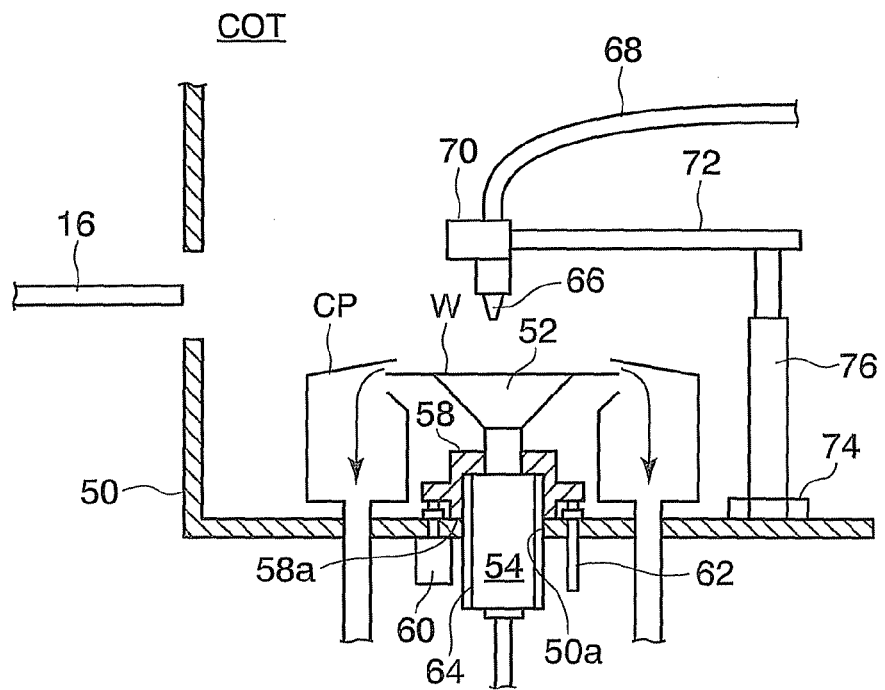
FIG. 4 is a sectional view showing a resist coating unit COT.
Figure 5:
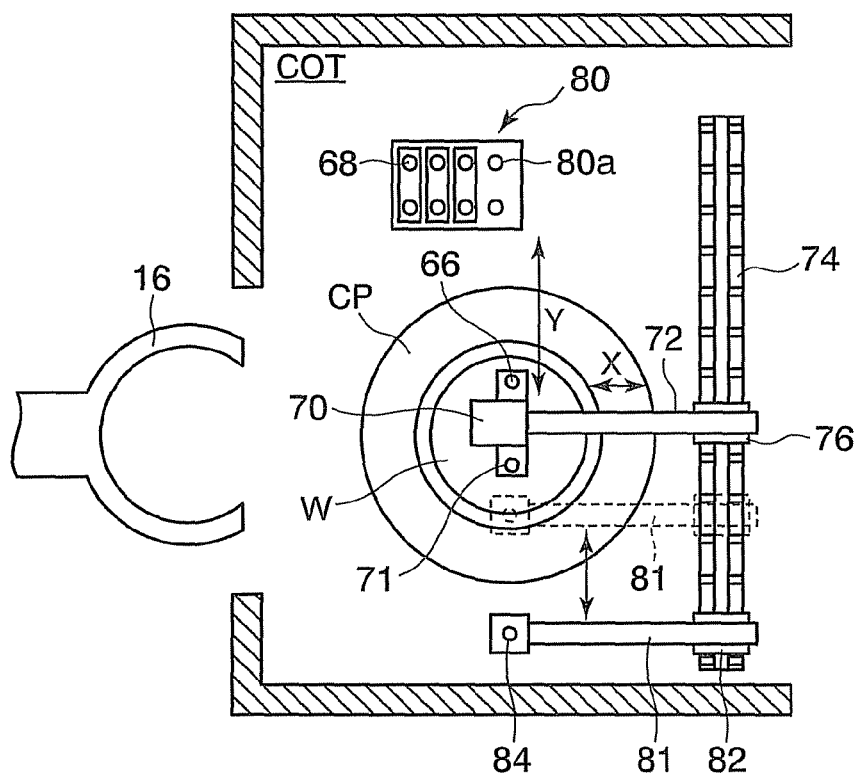
FIG. 5 is a plan view showing the resist coating unit COT.
Figure 6:
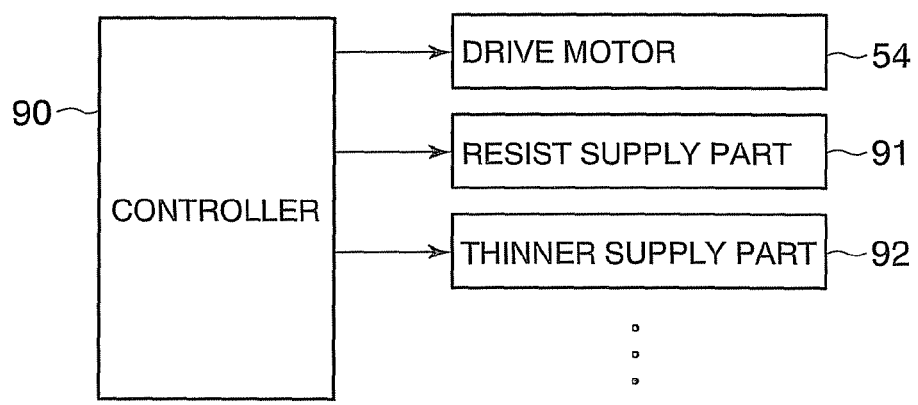
FIG. 6 is a view showing a structure of a control system of the resist coating unit COT.

Next, with reference to FIGS. 4 to 6, there is described the resist coating unit COT for performing a resist coating process (resist application), which is one of the processes in the resist-pattern forming method. FIGS. 4 and 5 are a sectional view and a plan view showing the resist coating unit COT. FIG. 6 is a view showing a structure of a control system of the resist coating unit COT.

As shown in FIGS. 4 and 5, an annular cup CP is provided at a center part of the resist coating unit COT, and a spin chuck 52 is provided within the cup CP. The spin chuck 52 is driven for rotation by a drive motor 54, while fixedly holding the wafer W by vacuum suction. The drive motor 54 is arranged so as to be movable upward and downward through an opening 50a provided in a unit bottom plate 50. The drive motor 54 is joined to elevating means 60 formed of an air cylinder and elevating guide means 62, via a cap-like flange member 58 made of, e.g., aluminum. A tubular cooling jacket 64 made of, e.g., a stainless steel, is provided on a side surface of the drive motor 54. The flange member 58 is disposed to cover an upper half of the cooling jacket 64.

During the resist application, a lower end 58a of the flange member 58 is sealingly in contact with the unit bottom plate 50 at a position near the outer periphery of the opening 50a, whereby the inside of the unit is hermetically sealed. When the wafer W is conveyed between the spin chuck 52 and the first main wafer transfer arm 16 of the first main transfer unit A1, the elevating means 60 brings upward the drive motor 54 or the spin chuck 52, so that the lower end of the flange member 58 can float up from the unit bottom plate 50.

A resist nozzle 66 for supplying a resist onto a surface of the wafer W is connected to a resist supply part, not shown, through a resist supply pipe 68. The resist nozzle 66 is removably attached to an end of a resist nozzle scan arm 72 via a nozzle holder 70. The resist nozzle scan arm 72 is mounted on an upper end of a vertical support member 76 capable of horizontally moving on a guide rail 74 laid on the unit bottom plate 50 in one direction (Y direction), whereby the resist nozzle scan arm 72, together with the vertical support member 76, can be moved in the Y direction by a Y-direction drive mechanism, not shown.

The resist nozzle scan arm 72 can be moved in the X direction perpendicular to the Y direction, in order allow a selected resist nozzle 66 to be attached to the resist nozzle scan arm 72 in a resist-nozzle waiting part 80. Thus, the resist nozzle scan arm 72 is moved in the X direction by an X-direction drive mechanism, not shown.

Further, in the resist-nozzle waiting part 80, a discharge port of the resist nozzle 66 is inserted into a mouth 80a of a solvent-atmosphere chamber and thus is exposed to the solvent atmosphere therein. Thus, solidifying or deteriorating of the resist solution adhering to the tip of the resist nozzle 66 can be prevented. Plural resist nozzles 66 are prepared, and these nozzles are used depending on the kind of the resist to be supplied to the wafer W.

Attached to an end (nozzle holder 70) of the resist nozzle scan arm 72 is a solvent nozzle 71, which supplies the wafer surface with a solvent, such as a thinner, for wetting the wafer surface prior to the supply of the resist to the wafer surface (pre-wetting). The solvent nozzle 71 is connected to a solvent supply part, which is described below, through a solvent supply pipe, not shown. The solvent nozzle 71 and the resist nozzle 66 are arranged such that the respective discharge openings thereof are positioned on a straight line along the Y direction in which the resist nozzle scan arm 72 is moved.

In addition to the vertical support member 76 supporting the resist nozzle scan arm 72, the guide rail 74 is provided with a vertical support member 82 supporting a rinse nozzle scan arm 81 and capable of moving in the Y direction. The rinse nozzle scan arm 81 and a rinse nozzle 84 are adapted to be moved by a Y-direction drive mechanism (not shown) translationally or linearly, between a rinse-nozzle waiting position (depicted by the solid lines), which is set on a lateral side of the cup CP, and a rinse-liquid discharge position (depicted by the dotted lines), which is set directly above the peripheral part of the wafer W placed on the spin chuck 52.

As shown in FIG. 6, a controller 90 is a member configured to control respective members in the resist coating unit COT. For example, the controller 90 controls the operation of the drive motor 54, and controls the resist supply part 91 and the solvent supply part (thinner supply part) 92. To be specific, the controller 90 controls the rotational speed of the drive motor 54 at various speed steps, for example, four speed steps during the resist application (five speed step when the solvent supply is included), which is described below. In addition, the controller 90 controls the supply of a resist from the resist supply part 91 to the resist nozzle 66, and the supply of a solvent, such as a thinner, from the solvent supply part 92 to the solvent nozzle 71.

Next, the resist pattern forming method is described.

Figure 7:
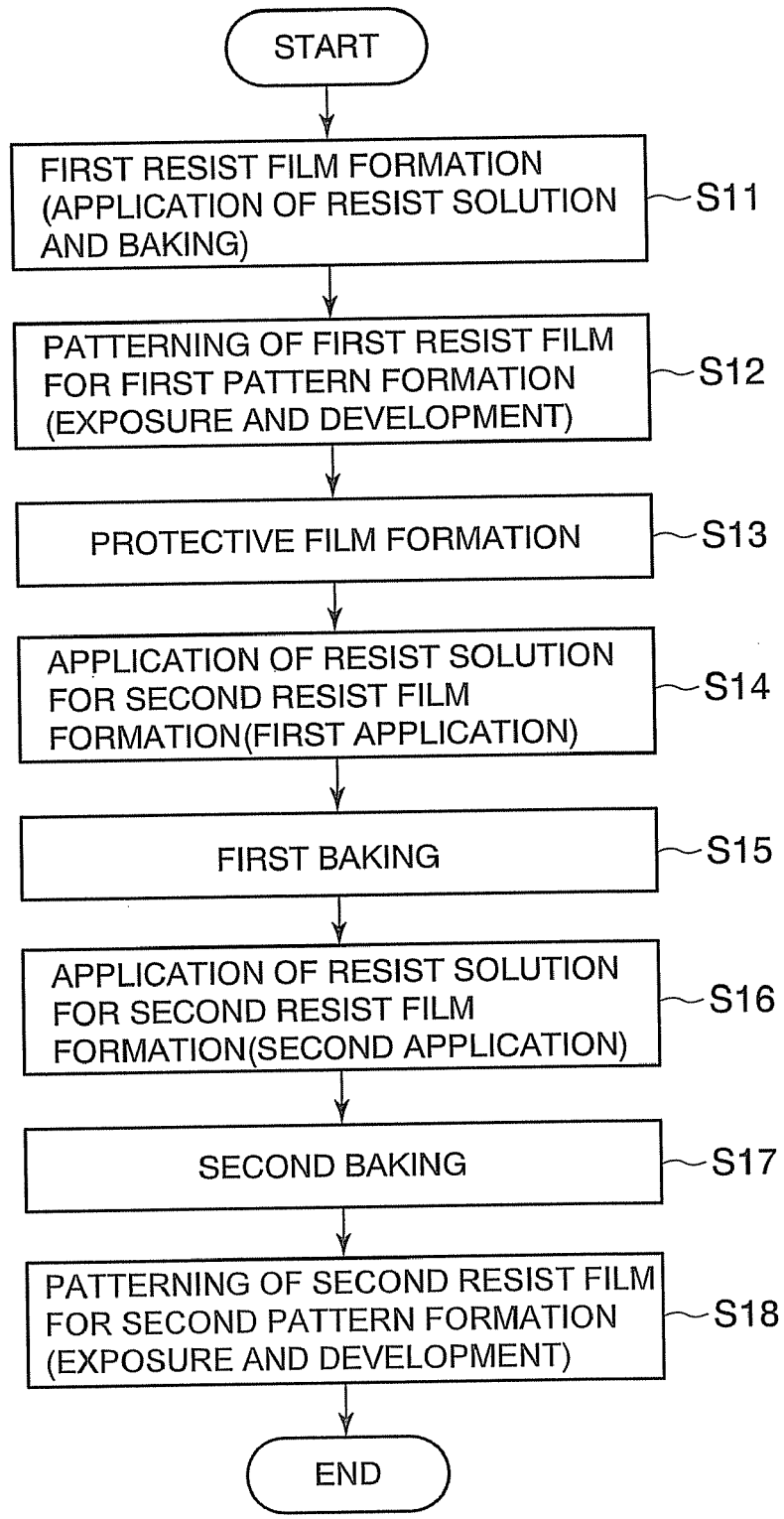
FIG. 7 is a flowchart for explaining procedures of respective steps of a resist pattern forming method in one embodiment.
Figure 8A:
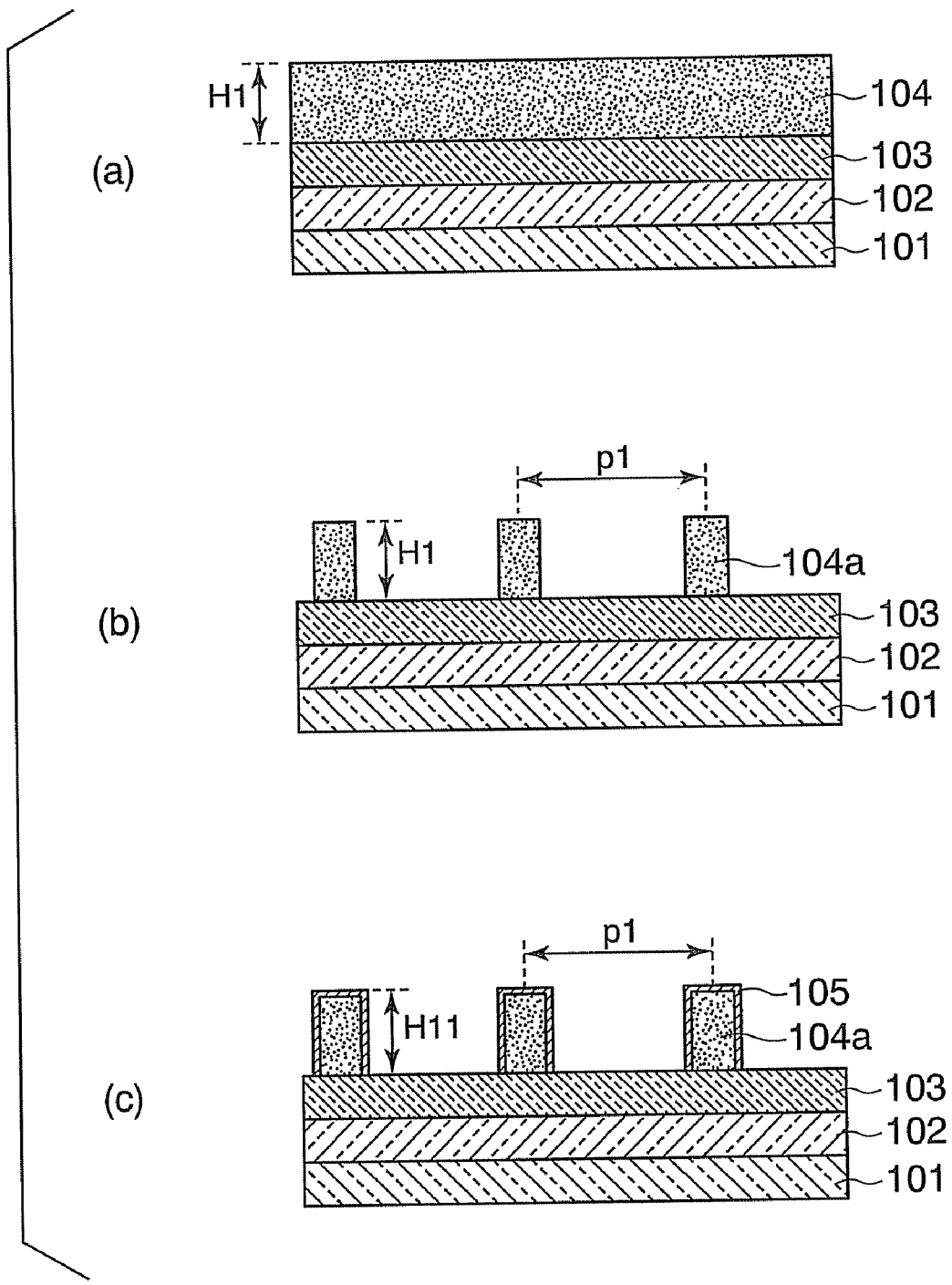
FIG. 8A is a sectional view (part I) schematically showing structures of a substrate surface in the respective steps of the resist pattern forming method in this embodiment.
Figure 8B:
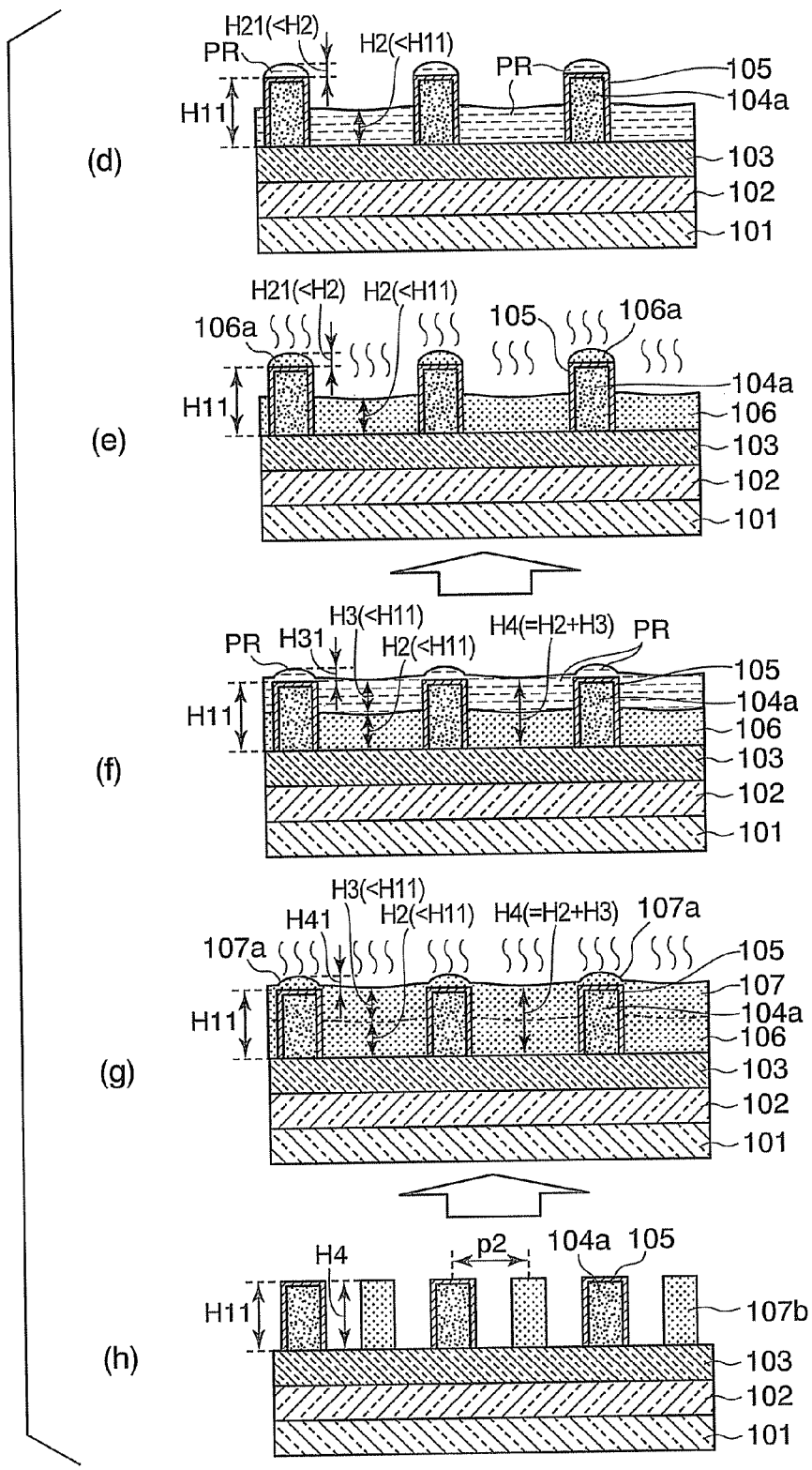
FIG. 8B is a sectional view (part II) schematically showing structures of the substrate surface in the respective steps of the resist pattern forming method in this embodiment.

FIG. 7 is a flowchart for explaining procedures of respective steps of the resist pattern forming method in one embodiment. FIGS. 8A and 8B are sectional views schematically showing structures of a substrate surface in the respective steps of the resist pattern forming method in this embodiment.

FIGS. 8A(a) to 8B(h) respectively show structures of the substrate surface, after the steps S11 to S18 have been performed.

As shown in FIG. 7, the resist pattern forming method includes a (first) resist film forming step (first resist film formation) (step S11), a first pattern forming step (first pattern formation) (step S12), a protective film forming step (step S13), steps for an additional (second) resist film formation (steps S14 to S18), and an additional second resist pattern forming step (second pattern formation) (step S18).

As shown in FIG. 7, the steps for the additional resist film formation (steps S14 to S17) includes resist applying (coating) steps (steps S14 and S16) and heat-treating (baking) steps (steps S15 and S17). Namely, the additional resist film forming step (steps S14 to S17) alternately repeats the resist applying step and the heat-treating step each twice.

The resist film forming step S11 is firstly performed. The step S11 applies a resist (resist solution) onto a substrate and heat-treats the substrate to form a first resist film. FIG. 8A(a) shows the structure of the substrate surface, after the step S11 has been performed.

As shown in FIG. 8A(a), in the step S11, a resist solution is applied onto the substrate on which an etch target layer 102 and an anti-reflecting film (BARC: Bottom Anti-Reflecting Coating) 103 have been formed beforehand. Then, heat treatment (baking) is performed to solidify the resist solution, thereby forming a resist film 104.

In this specification, the wording "semiconductor substrate (101)" refers not only to a bare substrate of a semiconductor, such as silicon, but also to any structure including a semiconductor device, a conductive film and an interlayer dielectric film, and so on which are formed in or on a semiconductor substrate and which constitute a circuit pattern.

The material of the etch target layer 102 is not particularly limited, but may be an insulation film made of, e.g., SiN or $SiO_2$, or a conductive film made of e.g., amorphous silicon or polysilicon. The thickness of the etch target layer is not particularly limited, but may be 100 nm, for example.

The material of the anti-reflecting film (BARC) 103 is not particularly limited, and there may be used various organic materials including amorphous carbon deposited by CVD (Chemical Vapor Deposition), polyphenol deposited by a spin-on method, and photoresist such as i-ray resist. The thickness of the anti-reflecting film (BARC) 103 is not particularly limited, but may be 30 nm, for example.

The material of the resist film 104 is not particularly limited, but ArF resist may be used, for example. The thickness H1 of the resist film 104 is not particularly limited, but may be 50 to 200 nm, for example. The resist applying (coating) conditions and the heat-treating conditions may be similar to those for the applying steps (steps S14 and S16) and the heat-treating step (steps S15 and S17), described later.

The resist applying conditions in the step S11 are not particularly limited, but the conditions shown in Table 1 below may be employed. For example, when the rotation speed is set at 1000 rpm in the step shown by the step number 4 in Table 1, the thickness H1 of 150 nm can be obtained. When the rotation speed is set at 2000 rpm in the step shown by the step number 4 in Table 1, the thickness H1 of 120 nm can be obtained.

TABLE 1

| Step No. | Process Period (sec) | Rotation Speed (rpm) | Acceleration (rpm/s) | Discharge Liquid |
|---|---|---|---|---|
| 1 | 1.0 | 2000 | 10000 | Solvent |
| 2 | 1.5 | 3000 | 10000 | Resist Solution |
| 3 | 1.0 | 100 | 30000 | — |
| 4 | 40 | 1000 | 10000 | — |
| 5 | 1.0 | 0 | 10000 | — |

The heat treatment conditions of heat treatment succeeding the resist application in the step S11 are not particularly limited. For example, the substrate may be heat at 120° C. for 90 seconds.

Then, the pattern (first pattern) forming step S12 is performed. The pattern forming step exposes and develops the resist film 104, thereby forming a pattern 104a of the resist film 104. FIG. 8A(b) shows the structure of the substrate surface, after the step S12 has been performed.

As shown in FIG. 8A(b), the step S12 processes the resist film 104 to from the pattern 104a of the resist film having a first pitch p1, with the use of the photolithographic technique. The pattern 104a is composed of pillars formed of the resist film. The pillars are spaced at intervals, i.e., at the first pitches p1. The first pitch p1 may be 180 nm, for example.

Then, the protective film forming step S13 is performed. The step S13 treats the surface of the pattern 104a of the resist film to form a protective film 105, thereby to complete the resist pattern. FIG. 8A(c) is a sectional view showing the structure of the substrate surface, after the step S13 has been performed.

A method of treating the surface of the pattern 104a of the resist film is not particularly limited, as long as the pattern 104a of the resist film is prevented from dissolving and/or degrading during the succeeding step, i.e., the steps for additional resist film formation. Herein, an alkali treatment is performed for protective film formation, by way of example.

The alkali treatment may be performed by immersing the substrate, which has thereon the pattern 104a of the resist film, into an alkali solution, or by applying an alkali solution onto the substrate by spin coating. The alkali solution is not particularly limited, but TMAH solution of 0.1 to 10% by mass, which is generally used as a developer, or an alkali solution such as a calcium hydroxide solution may be used.

As shown in FIG. 8A(c), the surface of the pattern 104a of the resist film is treated to form the protective film 105, whereby the formation of a first resist pattern is completed. Herein, the first resist pattern is the pattern 104a of the resist film on which the protective film 105 is formed. Under a state in which the protective film 105 is formed, the height of the pillar constituting the pattern 104a (i.e., the height of the top surface of the pillar with the protective film 105, which is measured from the part between the pillars, where no resist film 104 and no protective film 105 exist, as a reference) is H11. For example, when H1 is 120 nm and the thickness of the protective film 105 is 5 nm, H11 is 125 nm.

Alternatively, instead of the alkali treatment, a plasma treatment may be performed in a processing vessel in which a plasma, which is obtained by converting a halogen-containing gas such as fluorocarbon gas, or oxygen gas mixed with an inert gas such as Ar gas, is generated. In this case, since not only the surface of the pillar constituting the pattern 104a but also the base (103) between the pillars are coated with the protective film 105, the height H11 is approximately equal to the thickness of the resist film 104 (the height of the pillar on which the protective film 105 is not yet formed) H1.

Alternatively, instead of the alkali treatment, a water-repellent protective film (topcoat film) may be formed on the surface of the resist film by the top coating unit (ITC) described with reference to FIG. 2. Also in this case, since not only the surface of the pillar constituting the pattern 104a but also the base (103) between the pillars are coated with the protective film, the height H11 is approximately equal to the thickness of the resist film 104 (the height of the pillar on which the protective film 105 is not yet formed) H1.

Then, the steps (S14 to S17) for the second resist film formation are performed. First, the resist applying step (first application) S14 is performed. The step S14 applies a resist solution having a thickness smaller than the height H11 of the pillar constituting the pattern 104a. FIG. 8B(d) is a sectional view showing the structure of the substrate surface, after the step S14 has been performed.

As shown in FIG. 8B(d), the step S14 applies a resist solution PR for forming an additional (second) resist film from above the first resist pattern 104a with the protective film 105. Note that, the thickness H2 (which is supposed to be substantially identical to the thickness of the resist film 106 obtained after baking) of the resist PR is smaller than the height H11 of the pillar of the pattern 104a with the protective film 105. Further, since the spaces between the pillars of the pattern 104a are filled, by alternately repeating the resist application and the heat treatment for plural times, the application thickness of the resist PR that is applied by one-time application is approximately equal to a value obtained by dividing the height H11 of the pillar by the number of the repeated applications. In this embodiment, since the repeat time is, for example, two, H2 may be approximately equal to a value obtained by dividing H11 by two. Specifically, when H11 is 125 nm, and the number of the repeated applications is two, H2 is about 63 nm.

As shown in FIG. 8B(d), the resist solution PR having the thickness of H2 is applied to the space between the pillars of the pattern 104a, and the resist PR is also applied to the top surfaces of the respective pillars. Note that the application thickness H21 of the resist solution PR on the top surface of the pillar is smaller than the application thickness H2 of the resist solution between the pillars.

The material of the resist film 104 is not particularly limited, but ArF resist may be used, for example. Resist application conditions are not particularly limited, but the conditions shown in Table 2 below may be employed.

TABLE 2

| Step No. | Process Period (sec) | Rotation Speed (rpm) | Acceleration (rpm/s) | Discharge Liquid |
|---|---|---|---|---|
| 1 | 1.0 | 2000 | 10000 | Solvent |
| 2 | 1.5 | 3000 | 10000 | Resist Solution |
| 3 | 1.0 | 100 | 30000 | — |
| 4 | 40 | 2000 | 10000 | — |
| 5 | 1.0 | 0 | 10000 | — |

The rotation speed 2000 rpm shown in Table 2 in the step S14 is twice the rotational speed 1000 rpm shown in Table 1 in the step S11. When the step S11 and the step S14 use resists of the same viscosity, the thickness of the resist film 106 to be formed in the step S14 can be controlled by controlling the rotation speed. For example, when the rotation speed in the step shown by the step number 4 in Table 2, the thickness H2 of 63 nm can be achieved.

Then, the heat-treating step (first baking) S15 is performed. The heat-treating step bakes the resist solution thus applied to solidify the resist solution, through evaporation of the solvent contained in the resist solution, thereby forming a resist film. FIG. 8B(e) is a sectional view showing the structure of the substrate surface, after the heat-treating step S15 has been performed.

In the step S15, the substrate is placed on the aforementioned pre-baking unit PAB, for example, and, as shown in FIG. 8B(e), the heat treatment is performed by heating the substrate from below. The heat treatment conditions are not particularly limited, but the substrate may be heat-treated at 120° C. for 90 seconds, for example. As shown in FIG. 8B(e), a resist film (first resist layer) 106 having a film thickness approximately equal to the thickness of the resist solution thus applied, is formed in the spaces between pillars of the pattern 104a with the protective film 105. In addition, a resist film 106a having approximately the same shape as that of the resist solution PR applied thereto is formed on the top surface of each pillar.

Then, the resist applying step (second application) S16 is performed. The step S16 again performs the step S14 which is the first application. FIG. 8B(f) is a sectional view showing the structure of the substrate surface, after the resist applying step S16 has been performed.

As shown in FIG. 8B(f), the step S16 applies a resist solution PR for forming a resist film (second resist layer) 107 on the resist film 106. The material of the resist and resist application conditions may be the same as those of step S14 (first application). Similarly to the step S14, the thickness H3 of the resist solution PR (which supposed to be substantially identical to the thickness of the resist film 107 obtained after baking) is smaller than the height H11 of the pillar of the pattern 104a with the protective film 105. To be specific, H3 may be about 63 nm, for example.

As shown in FIG. 8B(f), the resist solution PR having the thickness of H3 is applied on the resist film 106 formed in the spaces between the pillars of the pattern 104a with the protective film 105. The film thickness H4, which is the sum of the thicknesses of the resist films 106 and 107 in the spaces between the pillars, is the sum of the film thickness H2 which is the thickness of the resist film 106 formed by the first application, and the film thickness H3 which is the application thickness of the resist PR formed by the second application (H4=H2+H3). Thus, the spaces between the pillars are filled with a resist film (in other words, the resist film composed of the first and second resist layers 106 and 107).

On the other hand, as shown in FIG. 8B(f), the resist PR is applied to the top surfaces of the pillars of the pattern 104a with the protective film 105. When the application thickness of the resist solution PR formed on the top surface of the pillar by the second application is H31, the final film thickens H41, which is the sum of the film thicknesses of the resist films 106a and 107a formed on the top surface of the pillar, is smaller than the sum of H21 which is the thickness of the resist film 106a obtained by the first application and the first heat treatment, and H31 which is the application thickness of the resist PR obtained by the second application.

Next, the heat-treating step (second baking) S17 is performed. The step S17 performs again the step S15 which is the first heat treatment. FIG. 8B(g) is a sectional view showing the structure of the substrate surface, after the resist applying step S16 has been performed.

As shown in FIG. 8B(g), similarly to the step S15, in the step S17, the heat treatment is performed by heating the substrate from below. The heat treatment conditions are not particularly limited, but the substrate may be heat-treated at 120° C. for 90 seconds, for example. As shown in FIG. 8B(g), the resist film 107 having a thickness approximately equal to that of the thus applied resist solution, is formed in the spaces between pillars of the pattern 104a with the protective film 105. In addition, a resist film 107a, having approximately the same shape as that of the resist solution PR applied on the top surface of each pillar, is formed thereon. Similarly to the step S16, in the spaces between the pillars, H4 is the sum of the film thickness H2 of the resist film 106 formed by the first application and the film thickness H3 of the resist film 107 formed by the second application (H4=H2+H3). In addition, the film thickness H41, which is the sum of the film thicknesses of the resist films 106a and 107a on the top surface of the pillar, is smaller than the sum of H21 which is the film thickness of the resist film 106a obtained by the first application and the first heat treatment, and H31 which is the application thickness of the resist solution PR obtained by the second application (H41<H21+H31).

Finally, the additional resist pattern forming step (exposure and development) 518 is performed. The additional resist-pattern forming step exposes and develops the resist films 106 and 107, thereby forming an additional (second) resist pattern 107b of the resist films 106 and 107. FIG. 8B(h) is a sectional view showing the structure of the substrate surface, after the step S18 has been performed.

As shown in FIG. 8B(h), the step S18 uses the photolithographic technique, in order that an additional resist pattern 107b, i.e., the second resist pattern 107b, is provided to the resist films 106 and 107 in the spaces between the pillars of the first resist pattern 104a with the protective film 105. Thus, a composite resist pattern formed of the first resist pattern 104a and the second resist pattern 107b is completed. The pitch p2 at which the pillars (104a, 107b) constituting the composite resist pattern are arrayed is approximately a half of the pitch p1 of the pillars (104a) constituting the first resist pattern 104a.

Next, the advantages of the method in this embodiment are described with reference to FIGS. 9 and 10.

Figure 9:
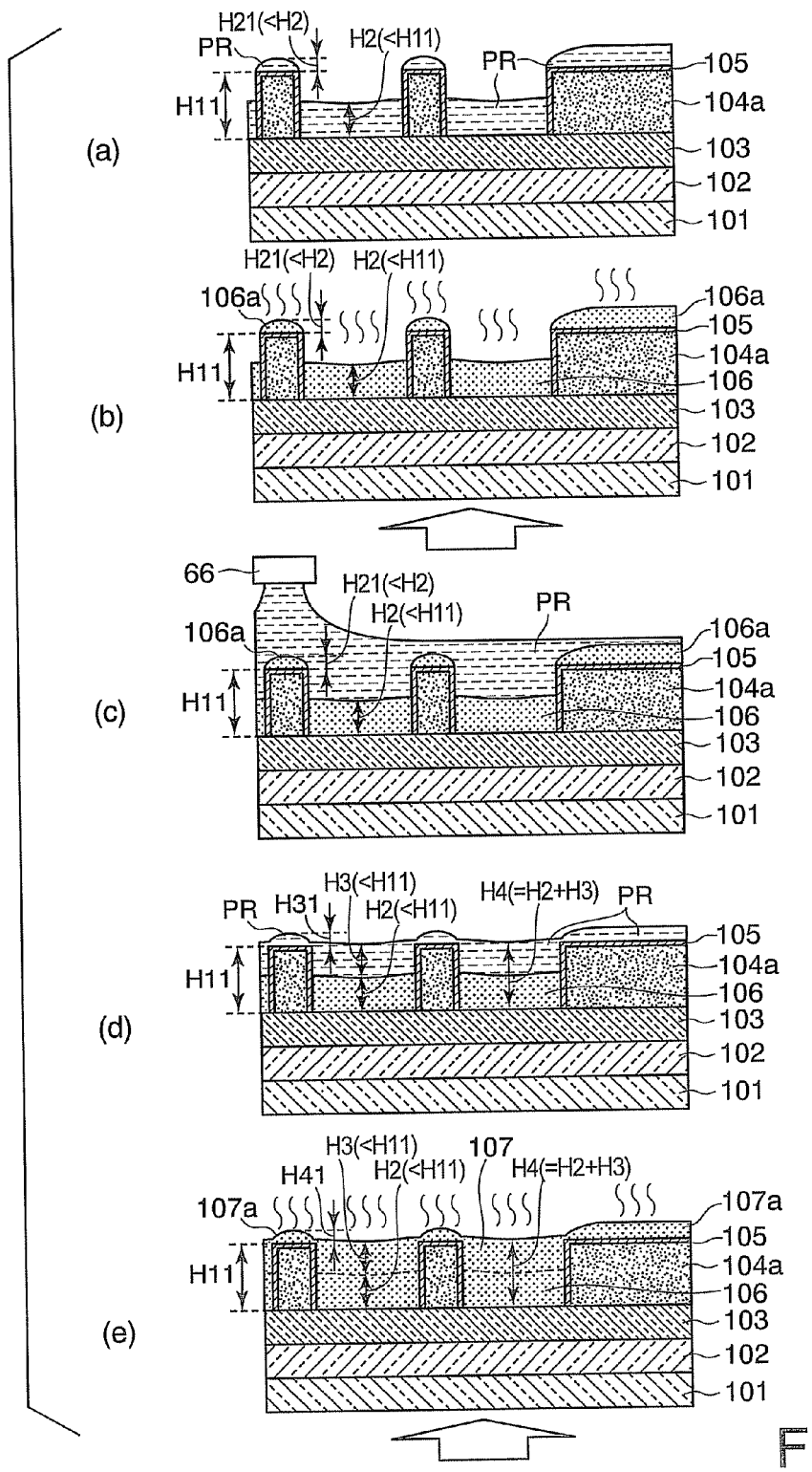
FIG. 9 is a sectional view schematically showing structures of the substrate surface in the respective steps of the resist pattern forming method in this embodiment.

FIG. 9 is a sectional view schematically showing the structures of the substrate surface in the respective steps of the method in this embodiment. FIG. 10 is a sectional view schematically showing structures of a substrate surface in respective steps of a conventional method.

Figure 10:
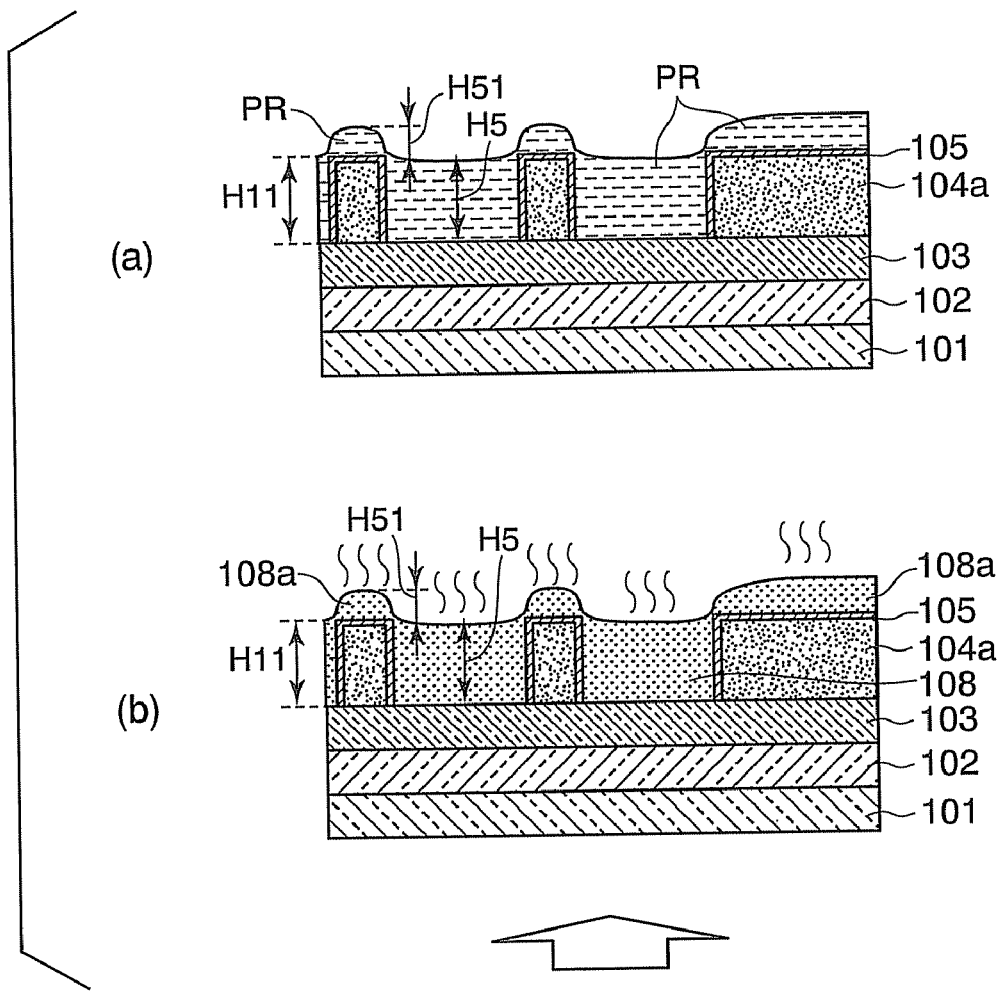
FIG. 10 is a sectional view schematically showing structures of a substrate surface in respective steps of a conventional resist pattern forming method.

In FIGS. 9 and 10, a dense pattern of regular interval having a narrow line width is shown on the left side; while a non-dense pattern having a thick line width or a non-dense pattern of irregular intervals is shown on the right side. Herebelow, the advantage in connection with the dense pattern on the left side are described.

Of these FIGS. 9(a) to 9(e), FIGS. 9(a), 9(b), 9(d) and 9(e) correspond to the steps S14, S15, S16 and S17, respectively. Namely, FIGS. 9(a), 9(b), 9(d) and 9(e) correspond to FIGS. 8B(d), 8B(e), 8B(f) and 8B(g), respectively.

In this embodiment, the thickness of the resist film 106a, which was formed by the resist applying step (first application) S14 shown in FIG. 9(a) and the heat-treating step (first baking) S15 shown in FIG. 9(b), on the pillar of the first resist pattern 104a with a protective film 105, is represented as H21. The thickness of the resist film 107a, which was then formed on the resist film 106a by the resist applying step (second application) S16 shown in FIG. 9(d) and the heat-treating step (second baking) S17 shown in FIG. 9(e), is represented as H31. The film thickness, which is the sum of the film thickness H21 of the resist film 106a and the film thickness H31 of the resist film 107a, is represented as H41.

At this time, H41 is smaller than the sum of H21 and H31. This is because all or portions of the resist film 106a on the pillars was dissolved in the application (second time) of the step S16.

As shown in FIG. 9(c), when the resist (resist solution) PR is applied from the resist nozzle 66, since the resist PR contains a solvent, all or portions of the resist film 106a on the pillars are dissolved in the resist PR. As a result, after the application of the resist PR has been finished, all the resist films 106a on the pillars are removed which is shown in FIG. 9(d), or portions of the resist films 106a are removed, which is not shown.

That is to say, the method in this embodiment is characterized in that, in the second or more times resist-solution application, the solidified resist, which has been formed on each of the pillars of the first resist pattern 104a on which the protective film 105 has been formed, is dissolved to be removed. Herein, the expression "resist is dissolved to be removed" means not only that all the resist is removed, but also that portions of the resist are removed.

As compared with the resist film 106a existing on top surface of the pillar of the first resist pattern 104a, the exposed surface area/volume ratio of the resist film 106 existing in the space between the pillars (lines) of the first resist pattern 104a is smaller. Thus, the resist film 106 is less dissolved in the second application of the resist solution.

For this reason, after the resist applying step (second application) S16 shown in FIG. 9(d) has been performed, the thickness H41, which is the sum of the film thicknesses of the resist film 106a and the resist film 107a, is smaller than the sum of H21 and H31 (H41<H21+H31). As shown in FIG. 9(d), since all the resist film 106a is dissolved to be removed by the second application, H41 is equal to H31. Moreover, when the application conditions of the resist PR in the resist applying step (second application) S16 and those in the resist applying step (first application) S14 are the same with each other, i.e., when H31 is approximately equal to H21, H 41 can be approximately equal to H21 (H41≈H21).

On the other hand, the application of a resist solution for forming an additional resist pattern according to the conventional method is performed as follows. As shown in FIG. 10(a), application conditions are set such that the space (height H11) between the pillars of the first resist pattern 104a with the protective film 105 is completely filled with the resist by one-time application. Then, as shown in FIG. 10(b), a heat treatment is performed to form a resist film 108. Namely, in the flowchart shown in FIG. 7, after the steps S14 and S15 have been performed, the method proceeds to the step S18, omitting the steps S16 and S17. When the resists of the same viscosity are used in the steps S11 and S14, the rotation speed in the step S14 is made equal to the rotational speed 1000 rpm shown in Table 1 in the step S11. In this case, the thickness H5 of the resist film 108 to be formed in each space of the pattern 104a of the resist film on which the protective film 105 has been formed, can be approximately equal to the film thickness H11. As a result, all the spaces between the pillars of the first resist pattern 104a with the protective film 105 can be filled with the resist by means of the one-time application (i.e., only by step S14).

However, in this case, the film thickness H51 of a resist film 108a formed on the top surface of the pillar of the first resist pattern 104a with the protective film 105 is larger than H21 shown in FIG. 9(b). As illustrated, although the film thickness is smaller near the upper edge of the pillar, H51 is approximately twice H21 (H51≈2×H21), when such smaller-thickness portions are ignored. Assuming that, in the second or more times resist application, all the resist, which has been formed on the pillars by the preceding resist application, is dissolved to be removed, H41=H21+H31≈H21≈(½)×H51. Namely, according to this embodiment, the surface undulation caused by the resist film formed on the pillars can be approximately halved, as compared with the conventional method. When the resist application is performed N times, the surface undulation can be made 1/N, as compared with the conventional method.

That is to say, according to this embodiment, the in-plane non-uniformity of a resist film, in more detail, the surface undulation of the resist film to be patterned in the second patterning of the double-patterning process, can be reduced.

The effect described in connection with the dense pattern shown on the left side in the respective drawings of FIG. 9 similarly holds true with the thin pattern shown on the right side. Thus, according to this embodiment, even when a dense pattern and a non-dense pattern are mixed, the in-plane non-uniformity of the resist film can be reduced.

Thus, it is possible to reduce the line-width variation of the additional (second) resist pattern that is formed by the second patterning of the double-patterning process.

In this embodiment, the line width of the first resist pattern 104a of the resist film formed by the (first) resist pattern forming step S12, and the line width of the additional resist pattern 107b formed by the additional (second) resist pattern forming step S18 are not adjusted. However, after the completion of the steps S12 and/or S18, a trimming step and/or a slimming step may be performed to adjust the line width of the pattern 104a and/or the pattern 107b of the resist film.

(First Modification)

Next, a first modification of the foregoing embodiment is described with reference to FIG. 11.

The first modification differs from the foregoing embodiment in that the thickness of the resist applied by the first application (S14) is less than a half of the thickness of the first resist pattern (i.e., the height of the pillar) H1.

Figure 11:
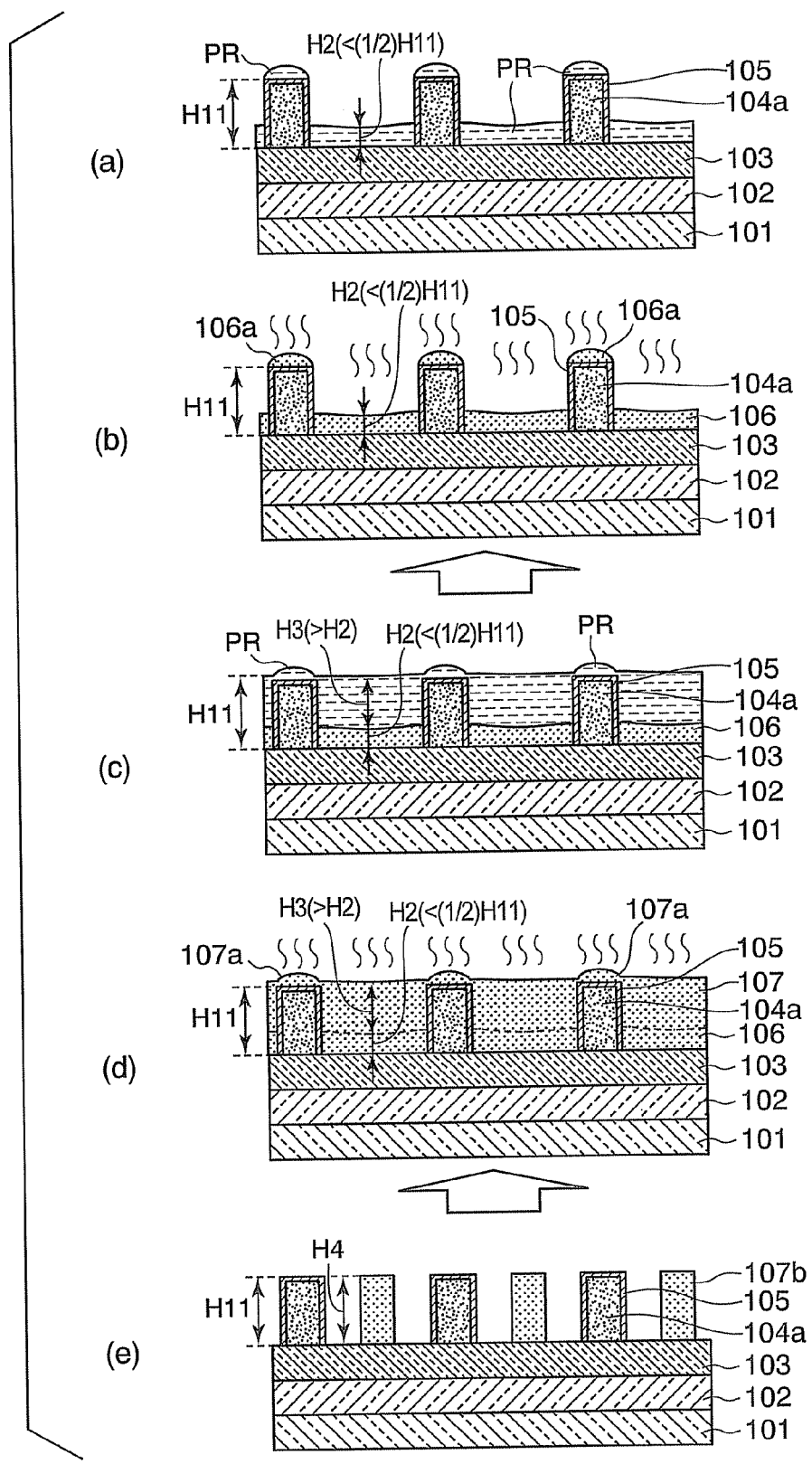
FIG. 11 is a sectional view schematically showing structures of a substrate surface in respective steps of the resist pattern forming method in a first modification.

FIG. 11 is a sectional view schematically showing structures of a substrate surface in respective steps of the resist film forming method in the first modification. FIGS. 11(a) to 11(e) correspond to the steps S14 to S18 shown in FIG. 7, respectively. Namely, FIGS. 11(a) to 11(e) correspond to FIGS. 8B(d) to 8B(h).

In this modification, by controlling the rotation speed of the substrate in the step S14 shown in FIG. 7, the application thickness of the resist solution in the step S14 (which is approximately equal to the film thickness H2 of the resist film 106) is made less than a half of the height H11 of the pillar of the first resist pattern 104a with the protective film 105 (H2<H11/2).

As described in the above embodiment, there is a possibility that, in the step S16 for the second resist application, all the resist film 106a on the top surface of the pillar of the first resist pattern 104a with the protective film 105 might not be dissolved to be removed. On the other hand, in the first modification, the application thickness of the resist solution in the first application (which is approximately equal to the film thickness of the resist film 106 in the space between the pillars) is made smaller. Thus, in the step S16 for the second resist application, the resist film 106a on the top surface of the pillar can be completely removed more easily. According to the first modification, the in-plane non-uniformity of the resist film can be more reduced.

In the first modification, the resist applying step and the heat-treating step are respectively performed twice, but may be respectively performed three times or more. In this case, the film thickness of the resist applied in the first application may be smaller than the film thickness of the resist applied in the second or more times application. Alternatively, the film thickness of the resist applied by a preceding application may be smaller than the film thickness of the resist applied by a succeeding application.

(Second Modification)

Next, the resist applying method in a second modification is described with reference to FIG. 12.

The second modification differs from the foregoing embodiment in that the heat treatment (baking) temperature in the first heat-treating step (S15) is lower than that in the second or more times heat-treating step (S17).

Figure 12:
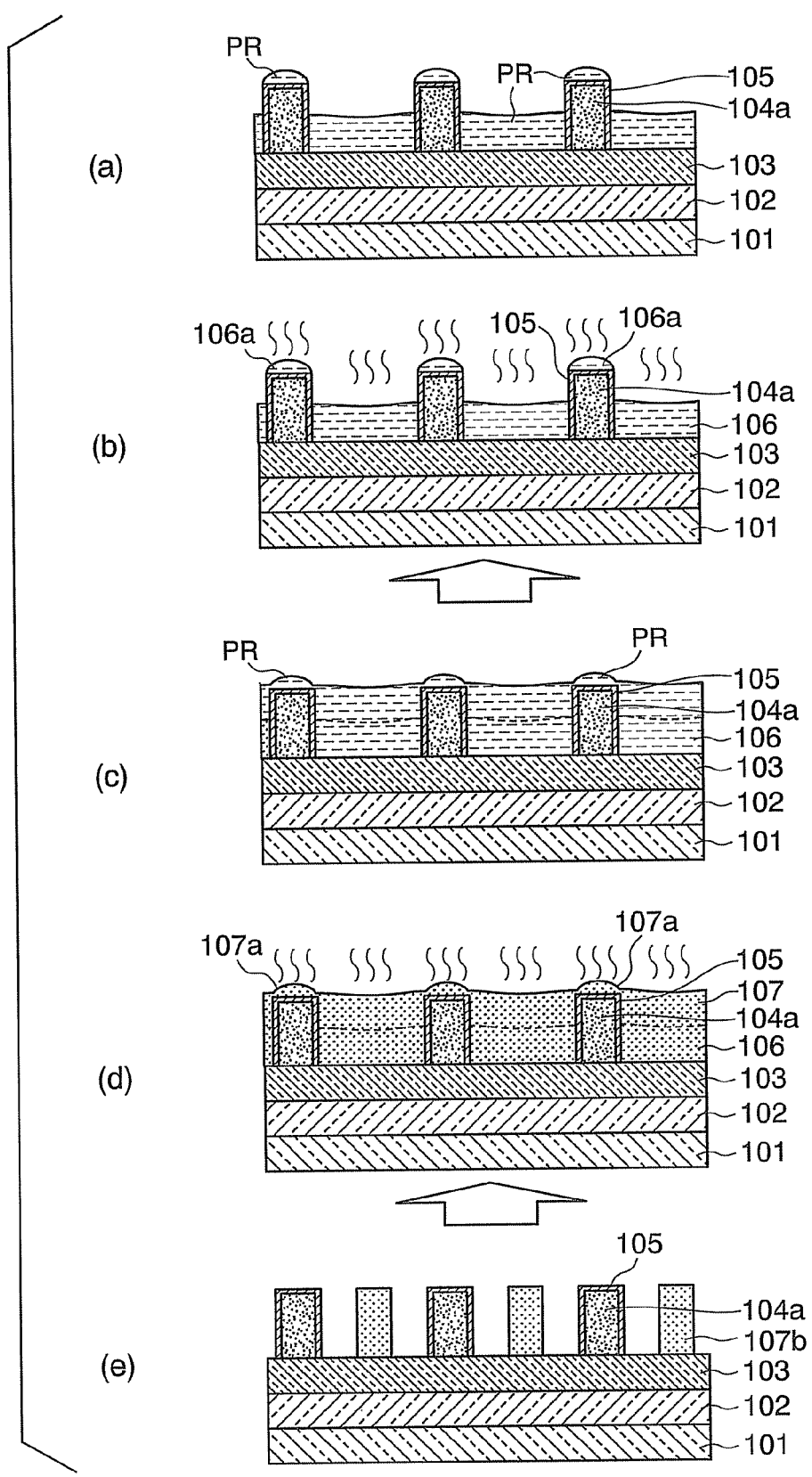
FIG. 12 is a sectional view schematically showing structures of a substrate surface in respective steps of the resist pattern forming method in a second modification.

FIG. 12 is a sectional view schematically showing structures of a substrate surface in respective steps of the resist-pattern forming method in the second modification. FIGS. 12(a) to 12(e) correspond to the steps S14 to S18 shown in FIG. 7, respectively. Namely, FIGS. 12(a) to 12(e) correspond to FIGS. 8B(d) to 8B(h), respectively.

In this modification, the heat treatment temperature in the step S15 shown in FIG. 7 is set lower than that in the step S17.

As described in the foregoing embodiment, there is a possibility that, in the step S16 that is the second application, all the resist film 106a on the top surface of the pillar of the first resist pattern 104a with the protective film 105 might not be dissolved to be removed. However, since the heat treatment temperature in the step S15 for the baking is lower than that in the step S17 for the second baking, the resist film 106a, which has been formed on the top surface of the pillar by the first resist application and the first baking, can be completely removed more easily in the step S16 for the second resist application. This is because, due to the low heat treatment (baking) temperature, the solvent in the resist film 106a is not fully vaporized after the first baking. According to the second modification, the in-plane non-uniformity of the resist film can be more reduced.

In the second modification, the resist application and the heat treatment (baking) are respectively performed twice, but may be respectively performed three times or more. In this case, the heat treatment (baking) temperature in the second or more times heat treatment may be higher than the heat treatment temperature in the preceding heat treatment (e.g., first heat treatment).

(Third Modification)

Next, a third modification is described with reference to FIGS. 13 and 14.

The third modification differs from the above embodiment in that the surface of the first resist pattern is not coated with the protective film.

Figure 13:
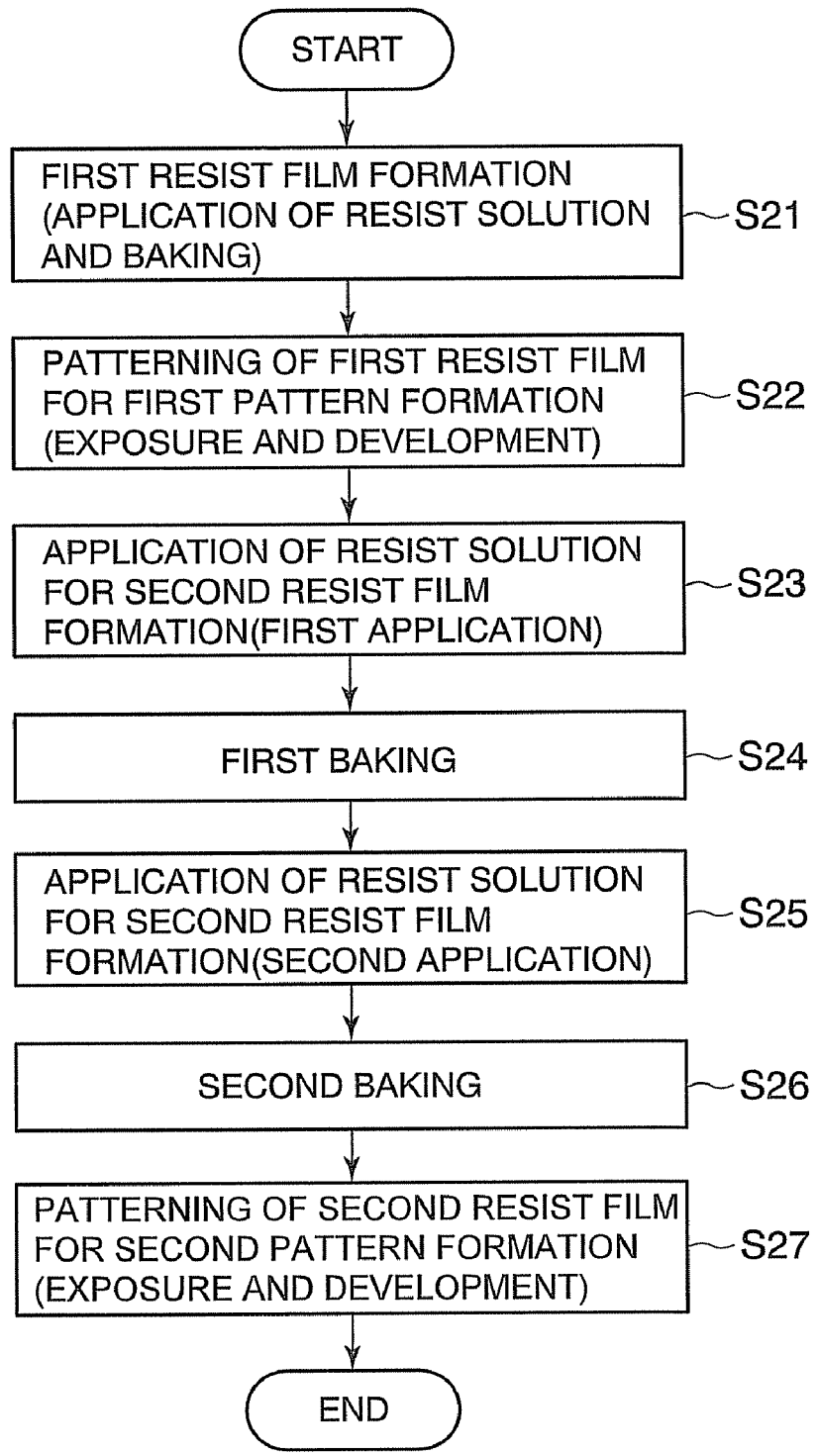
FIG. 13 is a flowchart for explaining procedures of respective steps of the resist pattern forming method in a third modification.
Figure 14A:
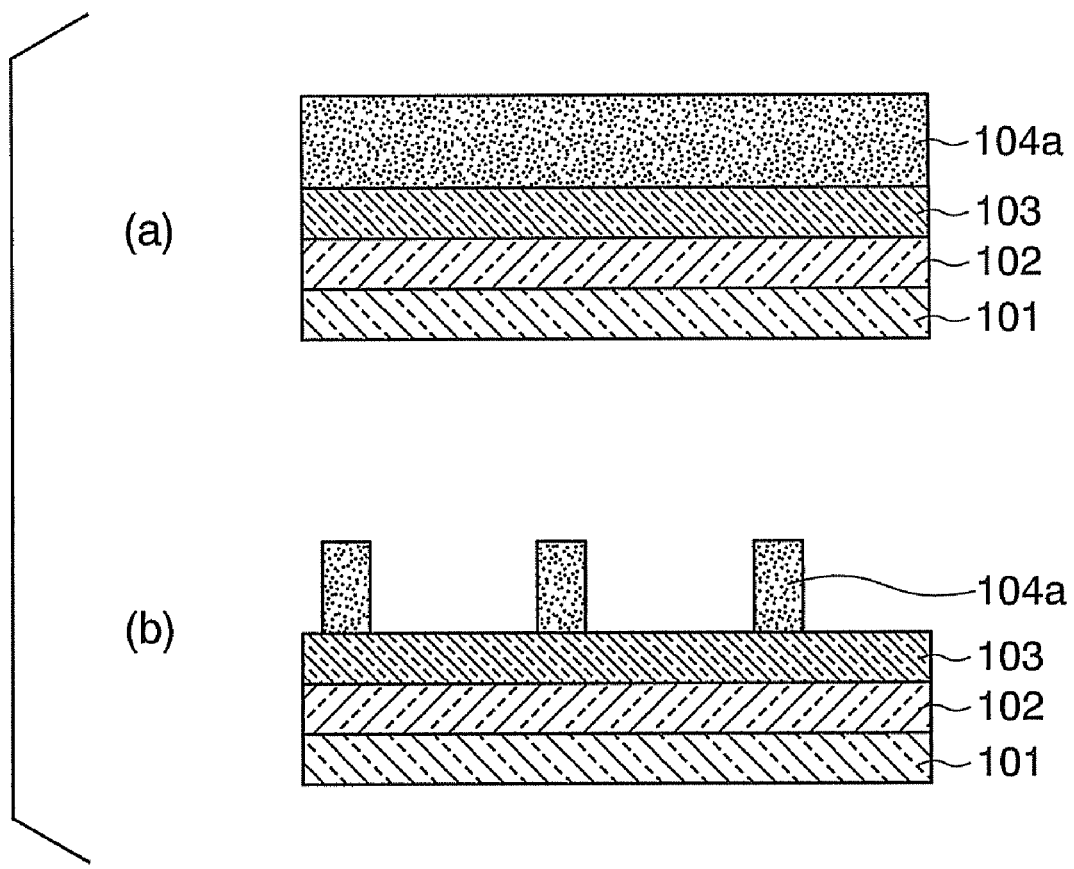
FIG. 14A is a sectional view (part I) schematically showing structures of a substrate surface in the respective steps of the resist pattern forming method in the third modification.
Figure 14B:
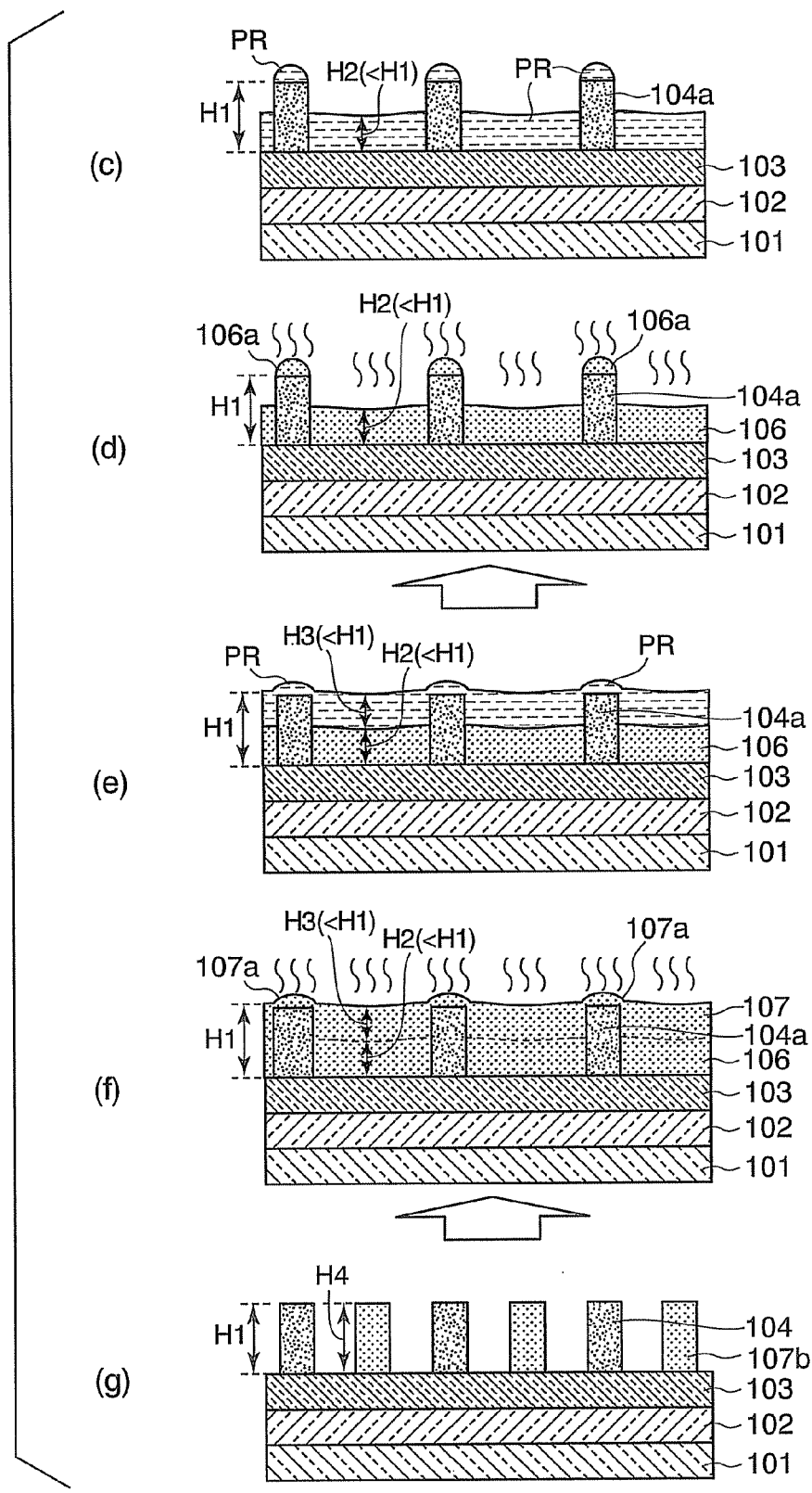
FIG. 14B is a sectional view (part II) schematically showing structures of the substrate surface in the respective steps of the resist pattern forming method in the third modification.

FIG. 13 is a flowchart for explaining procedures of respective steps of the method in the third modification. FIGS. 14A and 14B are sectional views schematically showing structures of a substrate surface in the respective steps of the method in the third modification.

FIGS. 14A(a) to 14B(g) respectively show the structures of the substrate surface, after the steps S21 to S27 have been performed, respectively.

As shown in FIG. 13, the resist film forming method in this modification includes a resist film (first resist film) forming step (step S21), a pattern (first pattern) forming step (step S22), the steps for an additional resist film (second resist film) formation (i.e., steps S23 to S26), and an additional resist pattern (second pattern) forming step (step S27).

As shown in FIG. 13, the steps for the additional resist film formation (steps S23 to S26) in this modification includes resist applying steps (steps S23 and S25) and heat-treating (baking) steps (steps S24 and S26). Namely, the additional resist film forming step (steps S23 to S26) in this modification alternately repeats the resist application and the heat treatment twice.

The resist film forming step (step S21) and the pattern forming step (step S22) in this modification are the same as the resist film forming step (step S11) and the pattern forming step (step S12) of the foregoing embodiment.

However, the method in this modification does not perform the protective film formation, which is shown as step S13 in FIG. 7 of the foregoing embodiment. After the pattern forming step (step S22) has been performed, the step S23 for the first resist application is performed.

The steps for the additional resist film formation (steps S23 to S26) and the additional resist-pattern forming step (step S27) in this modification correspond to the steps for the additional resist film formation (steps S14 to S17) and the additional resist pattern forming step (step S18) of in the foregoing embodiment, respectively.

Namely, except that the protective film 105 does not exist on the upper surface and the side surface of the pillar of the pattern 104a, FIGS. 14B(c) to 14B(g) are respectively identical to FIGS. 8B(d) to 8B(h) in the foregoing embodiment.

In the third modification, when the first resist pattern is formed, since no protective film is formed on the surface of the pattern of the resist film, the resist film is exposed to the surface of the pattern. However, by controlling the application conditions in the resist film formation shown in the step S21 and the exposure conditions and the development conditions in the pattern formation shown in the step S22, it is sometimes possible that the first resist pattern is not dissolved in the solvent contained in the resist solution that is succeedingly applied. In this case, the first resist pattern will not be dissolved even though the steps S23 and S25 for the first and second resist application are performed. Thus, similarly to the foregoing embodiment and the first and second modifications, the double patterning can be carried out. Also in this case, the same advantages as those of the embodiment and the first and second modifications can be achieved.

According to the third modification, variation in pattern dimensions of the composite resist pattern, which is formed by the double patterning process, can be also reduced.

Although the preferred embodiment has been described above, the present invention is not limited to the specific embodiment, but may be variously changed and modified within the scope of the claims. For example, the foregoing embodiment has been described by taking the application of the resist as an example. However, the foregoing method may be applied to any method that applies a solution other than the resist solution, e.g., a solution for forming an anti-reflecting film, an SOG (Spin On Glass) film, an SOD (Spin on Dielectric) film, and so on. In addition, in the above embodiment, although a wafer W is subjected to an application process, the present invention may be applied to an application process to another substrate such as an FPD (flat panel display) and a reticle for photomask.

The invention claimed is:

1. A resist film forming method comprising:
    preparing a substrate provided thereon with a first resist film having a first pattern of first pillars spaced at intervals, the pillars having a first height; and
    forming a second resist film on the substrate, including:
        applying a resist solution to the substrate such that at least spaces between adjacent first pillars are filled with a resist solution having a thickness smaller than the first height; and
        heat-treating the substrate to solidify the resist solution thus applied, thereby forming a resist layer;
        wherein the applying of the resist solution and the heat-treating of the substrate are performed alternately each at least twice, whereby the spaces between the adjacent first pillars are filled with resist layers, as the second resist film, having a total thickness at least approximately equal to the first height.

2. The method according to claim 1, wherein due to second or more times applying of the resist solution, at least portions of the resist layer, which have been formed by preceding applying of the resist solution and preceding heat-treating of the substrate and which exist on a top of each of the first pillars of the first resist pattern, are dissolved to be removed.

3. The method according to claim 2, wherein the applying of the resist solution and the heat-treating of the substrate are performed alternately each exactly twice.

4. The method according to claim 3, wherein first applying of the resist solution applies the resist solution having a thickness less than a half of the first height.

5. The method according to claim 4, wherein a heat treatment temperature in first heat-treating of the substrate is lower than that in second or more times heat-treating of the substrate.

6. The method according to claim 3, wherein a heat treatment temperature in first heat-treating of the substrate is lower than that in second or more times heat-treating of the substrate.

7. The method according to claim 2, wherein a heat treatment temperature in first heat-treating of the substrate is lower than that in second or more times heat-treating of the substrate.

8. The method according to claim 1, wherein the applying of the resist solution and the heat-treating of the substrate are performed alternately each exactly twice.

9. The method according to claim 8, wherein first applying of the resist solution applies the resist solution having a thickness less than a half of the first height.

10. The method according to claim 9, wherein a heat treatment temperature in first heat-treating of the substrate is lower than that in second or more times heat-treating of the substrate.

11. The method according to claim 8, wherein a heat treatment temperature in first heat-treating of the substrate is lower than that in second or more times heat-treating of the substrate.

12. The method according to claim 1, wherein a heat treatment temperature in first heat-treating of the substrate is lower than that in second or more times heat-treating of the substrate.

13. The method according to claim 1, further comprising:
after the forming of the second resist film, performing exposure and development to the second resist film, thereby providing the second resist film with a second pattern of second pillars such that each of the second pillars is located in a space defined between adjacent first pillars.

14. The method according to claim 1, wherein the preparing of the substrate includes;
applying a resist solution onto the substrate and heat-treating the substrate, thereby forming the first resist film on the substrate;
performing exposure and development to the first resist film, thereby providing the first resist film with the first pattern of first pillars; and
forming a protective film on each of the first pillars of the first pattern.

* * * * *